United States Patent
Hamre

[19]

[11] Patent Number: 5,808,529
[45] Date of Patent: Sep. 15, 1998

[54] PRINTED CIRCUIT BOARD LAYERING CONFIGURATION FOR VERY HIGH BANDWIDTH INTERCONNECT

[75] Inventor: John D. Hamre, Plymouth, Minn.

[73] Assignee: Storage Technology Corporation, Louisville, Colo.

[21] Appl. No.: 678,982

[22] Filed: Jul. 12, 1996

[51] Int. Cl.$^6$ .................................. H01P 3/08; H01P 5/00
[52] U.S. Cl. ........................... 333/246; 333/238; 333/260
[58] Field of Search .................................... 333/238, 246, 333/260

[56] References Cited

U.S. PATENT DOCUMENTS

| | | | |
|---|---|---|---|
| 3,218,584 | 11/1965 | Ayer | 333/246 |
| 4,513,266 | 4/1985 | Ishihara | 333/246 X |
| 4,543,544 | 9/1985 | Ziegner | 333/238 X |
| 4,980,659 | 12/1990 | Allard | 333/246 X |
| 4,988,306 | 1/1991 | Hopfer, III et al. | 439/66 |
| 5,013,249 | 5/1991 | Lindeman et al. | 439/66 |
| 5,055,054 | 10/1991 | Doutrich | 439/66 |
| 5,128,831 | 7/1992 | Fox, III et al. | 361/396 |
| 5,186,632 | 2/1993 | Horton et al. | 439/67 |
| 5,198,965 | 3/1993 | Curtis et al. | 361/386 |
| 5,258,730 | 11/1993 | Stern et al. | 333/246 |
| 5,261,826 | 11/1993 | Leeb et al. | 439/67 |
| 5,263,868 | 11/1993 | Renn et al. | 439/67 |
| 5,384,690 | 1/1995 | Davis et al. | 361/789 |
| 5,469,130 | 11/1995 | Okada et al. | 333/246 |

*Primary Examiner*—Robert Pascal
*Assistant Examiner*—Barbara Summons
*Attorney, Agent, or Firm*—Brooks & Kushman, P.C.

[57] ABSTRACT

A ground plane interconnection is provided on first and second substrates, the first and second substrates having respective first and second ground layers disposed on a first surface of each of the first and second substrates. A ground conductor strip is disposed on a second surface of the second substrate, wherein the ground conductor strip includes a plurality of electrically conductive members which pass through the second substrate to electrically couple the ground conductor strip and the second ground layer. The first substrate is positioned with respect to the second substrate such that when the first substrate is placed proximate the second substrate, the ground conductor strip electrically couples the first and second ground layers to form a continuous ground plane. A method of forming a reduced-inductance continuous ground plane is also provided.

15 Claims, 3 Drawing Sheets

PRINTED CIRCUIT BOARD LAYERING CONFIGURATION FOR VERY HIGH BANDWIDTH INTERCONNECT

FIELD OF THE INVENTION

The present invention relates generally to conductor interconnections. More particularly, the present invention relates to a conductor strip and substrate interconnect configuration exhibiting low inductance and high bandwidth characteristics.

BACKGROUND OF THE INVENTION

Printed circuit board (PCB) substrates carrying high frequency signals (upwards of or greater than 1 gigahertz) often include microstrip or stripline conductor configurations for providing shielding and controlled impedance for the high frequency signals. For purposes of signal integrity, it is often necessary or desirable to interconnect these substrates to form one continuous substrate. In most cases this type of interconnect is accomplished with coaxial type connectors because of their high frequency capabilities—in the tens of gigahertz range. A limitation of coaxial type connectors is their large size, and their interconnect density is low relative to elastomeric, flex circuit, or standard pin and socket-type connectors.

A flex circuit provides a method of interconnecting such substrates. One such flex circuit is described in U.S. Pat. No. 5,261,826 entitled "Device for Contacting Shielded Conductors," issued Nov. 16, 1993 to Leeb et al. The Leeb et al. device contacts two shielded conductors, each one of which is embedded in or located on a dielectric sheet or laminate. In the Leeb et al. device the ground plane is used as a shield to completely surround a signal trace. The contact for a ground is made from the surface layer of one of the substrates to the surface layer of the other substrate. A via or plated through-hole is used to connect the signal from the surface layer to an internal layer and the signal is further propagated through the substrate. The via is a location in the signal path where a discontinuity in the impedance of the transmission path will occur. These impedance discontinuities result in a reduction of the bandwidth of the signal transmission path.

A need exists for a flex circuit interconnection that has a low inductance, continuous ground plane between the interconnecting substrates. At the same time, unlike the signal traces of Leeb et al., this flex circuit interconnection should provide a tightly controlled impedance with low discontinuity between signal traces.

The present invention provides a solution to these and other problems, and offers other advantages over the prior art.

SUMMARY OF THE INVENTION

The present invention relates to a ground plane interconnection including a ground conductor strip having a plurality of conductive members which allows a continuous ground plane to be formed between the ground planes of interconnecting substrates, thereby reducing inductive effects. The present invention also relates to an interconnection which has a signal conductor geometry that can be configured to provide a constant transmission line impedance from one substrate to the other (i.e., low discontinuity between signal traces).

In accordance with one embodiment of the invention, a ground plane interconnection is provided on first and second substrates, the first and second substrates having respective first and second ground layers disposed on a first surface of each of the first and second substrates. A ground conductor strip is disposed on a second surface of the second substrate, wherein the ground conductor strip includes a plurality of electrically conductive members which pass through the second substrate to electrically couple the ground conductor strip and the second ground layer. The first substrate is positioned with respect to the second substrate such that when the first substrate is placed proximate the second substrate, the ground conductor strip electrically couples the first and second ground layers to form a continuous ground plane. A method of forming a continuous ground plane is also provided in which the ground planes in adjacent circuit boards are coupled to form a reduced inductance, continuous ground plane.

In accordance with another embodiment of the invention, a circuit interconnection is provided which includes at least a first and a second substrate, where each substrate has a first ground layer with an exposed bottom side and a top side positioned proximate a first dielectric layer. Each substrate has at least one signal trace positioned between the first dielectric layer and a second dielectric layer, where the signal trace and the second dielectric layer extend beyond the end of the first ground layer and the first dielectric layer. Each substrate further has a second ground layer positioned between the second dielectric layer and a third dielectric layer, where the second ground layer and the third dielectric layer extend beyond the end of the signal trace and the second dielectric layer. The first and second substrates are formed such that when one substrate is rotated 180 degrees with respect to the other substrate into a mating position, the first ground layers, the signal trace, and the second ground layers of the first and the second substrates are each electrically coupled to one another to form a mated circuit interconnection.

These and various other features as well as advantages which characterize the present invention will be apparent upon reading of the following detailed description and review of the associated drawings.

DETAILED DESCRIPTION

Figure 1:
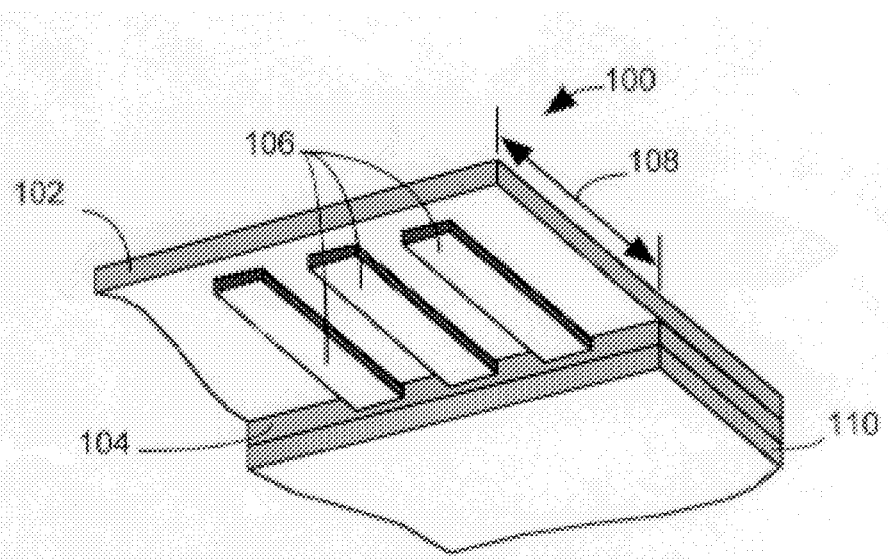
FIG. 1 is a diagram of a printed circuit board substrate.

Referring now to FIG. 1, a printed circuit board (PCB) substrate 100 is shown. The substrate is the physical supporting material upon which an electronic circuit is fabricated. The substrate 100 of the preferred embodiment is made of flexible materials so that the substrate 100 as a whole is flexible. Substrate 100 has a first dielectric layer 102, and second dielectric layer 104. Disposed between dielectric layers 102 and 104 are signal traces 106 that carry electronic signals through the substrate 100. Dielectric 102 extends a distance 108 beyond dielectric 104, thereby exposing a portion of signal traces 106. The exposed portions of the signal traces may be coupled to signal traces of another substrate to form a complete signal path, as will be described more fully below.

The signal traces 106 of the preferred embodiment can be a part of either a stripline transmission system or a microstrip transmission system. Stripline is a type of transmission line used in a circuit consisting of a narrow, flat conductor sandwiched between, and insulated from, wider flat grounded conductors. Microstrip is a transmission system in which a single conductor is supported above a ground plane. Substrate 100 of FIG. 1 represents a microstrip substrate having ground plane 110, dielectric layers 102 and 104, and signal traces 106.

Figure 2:
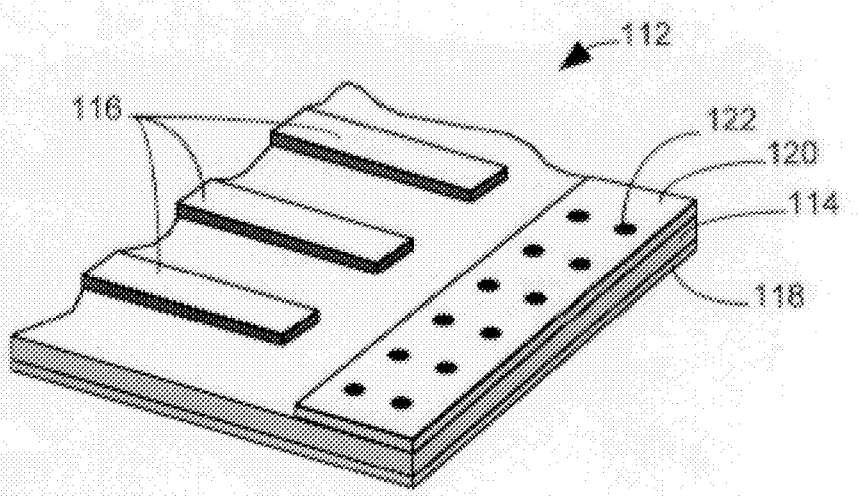
FIG. 2 is a diagram of a printed circuit board substrate having a ground conductor strip.

Referring now to FIG. 2, substrate 112 represents a second substrate that can be connected to substrate 100 to form a continuous interconnection of the substrates. The portion of substrate 112 shown in FIG. 2 includes dielectric material 114 and signal traces 116. A ground layer 118 is formed on the dielectric layer 114 opposite the signal traces 116. Also, coupled to dielectric layer 114 is a conductor strip 120 which engages the dielectric layer 114 beyond the end of signal traces 116. The conductor strip 120 of the preferred embodiment is photographically generated on the surface of the dielectric layer 114. Alternatively, other types of strip deposit techniques can be used, such as chemical, vapor, electrical, vacuum, or other processes.

As will be appreciated by those skilled in the art, very high bandwidth signals require tightly controlled impedance signal transmission paths in order to avoid reflecting power that is intended to be transmitted. Discontinuities in the geometry of the signal path or the ground path result in variations in the distributed inductance and capacitance of the transmission path. Since the impedance of the transmission path is indicated by the ratio of these distributed parameters, and the amount of the signal that is reflected is determined by the variation in the transmission line impedance, avoiding ground plane and signal trace discontinuities is of the utmost importance. The large number of conducting through-holes reduces the inductance and allows the impedance of the ground interconnect to match that of the ground plane on the substrate.

The conductor strip 120 of FIG. 2 includes a plurality of openings 122 which extend from the conductor strip 120 through the dielectric layer 114, to the ground layer 118. Conductive members are formed in openings 122 to electrically connect conductor strip 120 to ground layer 118. These conductive members allow ground layer 110 of substrate 100 to be directly coupled to a ground layer that contacts the conductor strip 120.

Figure 3:
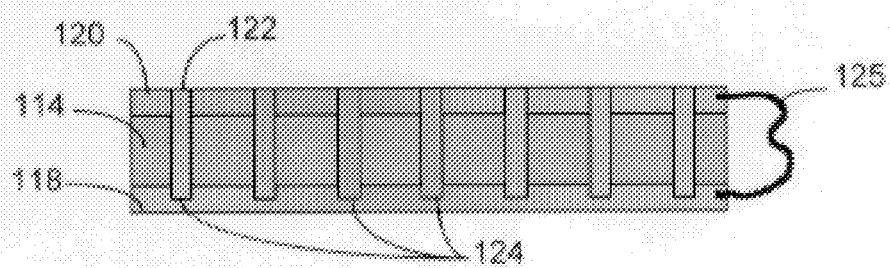
FIG. 3 is a cross-sectional view of the ground conductor strip.

FIG. 3 shows a cross-sectional view of the conductor strip 120 having openings 122, ground layer 118, and conductive members 124. Openings 122 can be formed by boring through conductive strip 120 and the dielectric layer 114 below conductive strip 120. The conductive members 124 can be solid conductors, conductive through-holes or vias, or other conductive members. Solid conductors can be positioned between conductive strip 120 and ground layer 118 through openings 122. Similarly, conductive through-holes can be formed onto the inner walls of openings 122 to provide an electrical connection between conductive strip 120 and ground layer 118. It is also conceivable to provide a conductive strip 120 having fixed conductive members 124 further being fixed to ground layer 118, and forming the dielectric layer 114 around conductive members 124. A relatively large number of conductive members 124 connecting the conductive strip 120 to ground layer 118 are used to maintain a high conductivity and low inductance at a connection point between a ground layer of another substrate and the conductive strip 120.

As an alternative (or in addition) to the conductive members 124, a flex conductor 125 can be electrically coupled between conductive strip 120 and ground layer 118. One or more flex conductors 125 can be used similarly to the conductive members 124, by providing a low impedance current path between the conductive strip 120 and ground layer 118. This is particularly beneficial for use with substrates in which openings 122 have not been provided.

Figure 4:
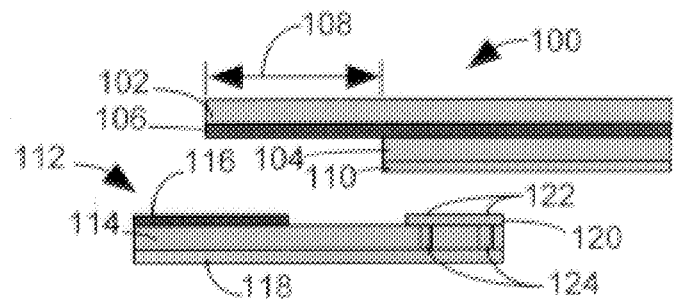
FIG. 4 illustrates the positioning of two substrates which allows for connection of their signal traces and ground layers.

Referring now to FIG. 4, substrate 100 can be oriented in a manner to allow connection of its signal traces 106 and ground layer 110 to the signal traces 116 and conductive strip 120 of substrate 112. Substrate 100 is placed so that signal traces 106 are facing signal traces 116 of substrate 112. The extension 108 of dielectric 102 and signal traces 106 beyond that of dielectric 104 and ground layer 110, allows signal traces 106 to be coupled to signal traces 116 of substrate 112. Substrate 112 also includes a second dielectric layer (not shown) above signal traces 116, that provides an exposed portion of the signal traces 116, which is the portion of the signal traces 116 seen in FIG. 4.

The orientation of substrates 100 and 112 in FIG. 4 also depicts the manner in which ground layer 110 is electrically coupled to ground layer 118. In connecting substrate 100 to substrate 112, the parallel plane of ground layer 110 will make contact with conductor strip 120, thereby connecting ground layer 110 to ground layer 118 through conductive members 124. This is described more fully in connection with the description of FIG. 5 below.

Figure 5:
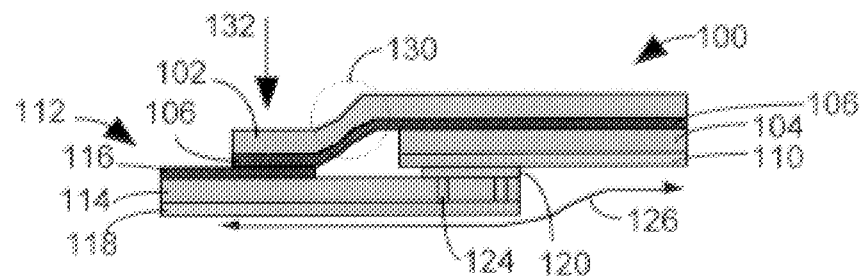
FIG. 5 is a diagram of two substrates electrically coupled to form a continuous ground plane, and to form continuous signal traces.

Referring now to FIG. 5, the interconnection of substrate 100 and substrate 112 of the preferred embodiment is shown. As previously described, ground layer 110 of substrate 100 makes contact with conductor strip 120 when substrate 100 is moved into contact with substrate 112. This interconnection provides a direct electrical contact from ground layer 110, through conductor strip 120, conductive members 124, to ground layer 118. Electrical currents can therefore flow directly from ground layer 110 to ground layer 118, and vice-versa, as shown by arrow 126. This mechanical configuration allows the ground layers 110 and 118 to mate in such a way that an extremely low inductance current path is produced.

Figure 6:
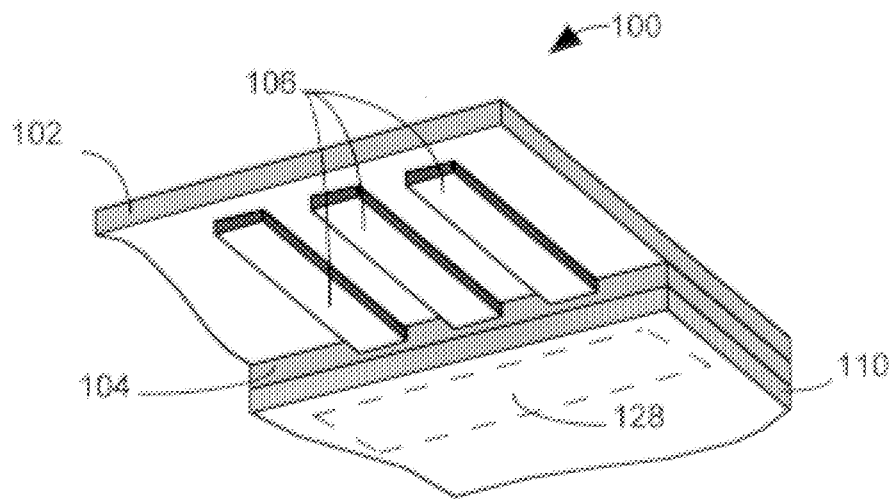
FIG. 6 illustrates the contact location of the ground conductor strip and the ground layer of a connecting substrate.

The area where conductor strip 120 of substrate 112 contacts the ground layer 110 of substrate 100 can be seen in FIG. 6. The conductor strip 120 contacts the ground layer 110 over the entire surface of conductor strip 120. This can be seen by the dashed area 128, which depicts the location of the contact point of conductor strip 120 when the substrates 100 and 112 are interconnected.

Again referring to FIG. 5, substrate 100 of the preferred embodiment has a flexible dielectric 102 and signal traces 106 to allow the signal traces 106 to be coupled to the signal traces 116 of substrate 112. This can be seen by referring to flex area 130, which shows a non-planar portion of substrate 100. The "flexing" of substrate 100 in the flex area 130 occurs as a result of applying a pressure to substrates 110 and/or 112 to reduce the contact resistance between conductor strip 120 and ground layer 110. More specifically, pressure is applied to dielectric 102 and signal traces 106 in the direction of arrow 132. The curvature in flex area 130 allows an electrical contact to be made between signal traces 106 and signal traces 116 on substrate 100 and 112 respectively.

Signal traces 106 and 116 can be reduced in width in situations where maintaining a constant signal trace impedance is critical. By reducing the signal traces in width, they are correspondingly reduced in volume. As shown in FIGS. 1 and 2, for example, by reducing the width of each signal trace by half as designated by dashed lines 107 and 117, respectively, the corresponding volume of each trace will also be reduced by half. Because there is an overlap of signal traces 106 and 116 where the electrical contact is made, the impedance is reduced due to the additional current-carrying capacity. By reducing the width and thus the volume of the signal traces at the contact location, the impedance can be restored to more closely match that of the remaining portions of the signal traces.

Figure 7:
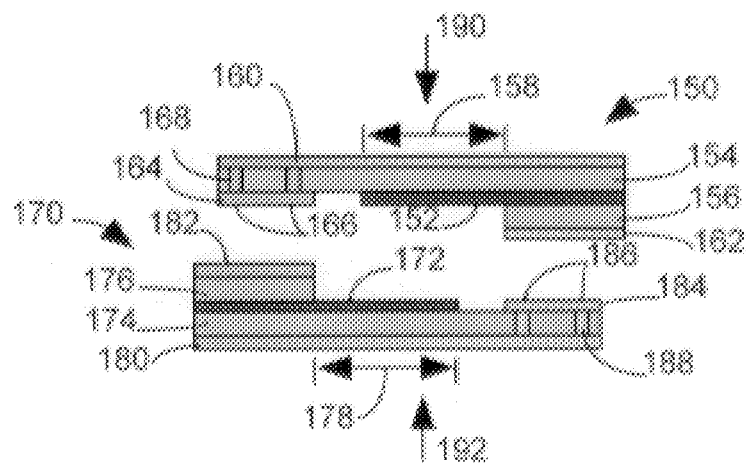
FIG. 7 illustrates the positioning of two stripline substrates which forms two continuous ground planes.

Referring now to FIG. 7, the principles described above may also be applied to stripline having conductive layers on both sides of the dielectric encompassing the signal traces. FIG. 7 shows a first stripline substrate 150 having signal traces 152 disposed between two dielectric layers 154 and 156. A portion of signal traces 152 are not totally encompassed by dielectric layers 154 and 156, as can be seen by the signal trace portion formed on dielectric layer 154 over the distance 158. A first ground layer 160 and a second ground layer 162 comprise the two ground planes in the stripline transmission substrate 150.

The conductor strip 164 is used similarly to conductor strip 120 of the microstrip substrate 112 described above. Conductor strip 164 includes multiple openings 166 for providing access to conductive members 168. Conductive members 168 provide an electrical connection between conductor strip 164 and the first ground layer 160.

FIG. 7 also shows a second stripline substrate 170 having signal traces 172 disposed between two dielectric layers 174 and 176. A portion of signal traces 172 are also exposed over a distance 178 from the truncated edge of dielectric layer 176. A first ground layer 180 and a second ground layer 182 comprise the two ground planes in the stripline transmission substrate 170. Conductor strip 184 includes multiple openings 186 for providing access to conductive members 188. Conductive members 188 provide an electrical connection between conductor strip 184 and the first ground layer 180. Again, the conductive members 168 and 188 can be solid conductors, conductive through-holes or vias, or other conductive members.

Substrate 150 can be oriented in a manner to allow connection of its signal traces 152 and second ground layer 162 to the signal traces 172 and conductive strip 184 of substrate 170 respectively. Likewise, second ground layer 182 is oriented to allow planar contact with conductive strip 164 of substrate 150. Substrates 150 and 170 are oriented so that the extended portions of signal traces 152 are facing the extended portions of signal traces 172. The extended portions of signal traces 152 and 172, along dielectric layers 154 and 174 respectively, allow signal traces 152 and 172 to be coupled together when the substrates are moved into contact with each other.

In one embodiment of the invention, such striplines are used, and the associated substrates are made of a pliable material so that one or both of the substrates 150 and 170 are flexible. This flexibility allows an interconnection of the signal traces of substrates 150 and 170 to be made by applying a pressure on substrate 150 in the direction of arrow 190, or by applying a pressure on substrate 170 in the direction of arrow 192, or both. The substrates will flex in the area of the exposed signal traces 152 and 172, so that these signal traces contact each other.

Figure 8:
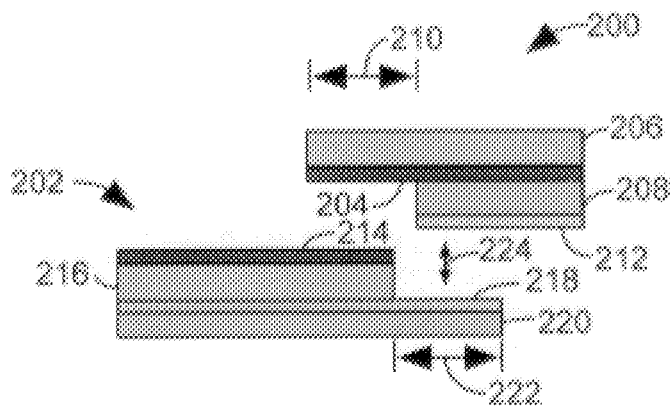
FIG. 8 illustrates another embodiment of two microstrip substrates which form one continuous ground plane.

Referring now to FIG. 8, the principles described for the interconnection of FIG. 7 may also be applied to microstrip substrates 200 and 202 of FIG. 8. Substrate 200 has one or more signal traces 204 disposed between two dielectric layers 206 and 208. A portion of the signal traces 204 are not totally encompassed by dielectric layers 206 and 208. This can be seen by the signal trace portion formed on dielectric layer 206 over the distance 210. A first ground layer 212 is disposed on dielectric layer 208.

Substrate 202 similarly has one or more signal traces 214 disposed on dielectric layer 216. A ground layer 218 is disposed between dielectric layer 216 and another dielectric layer 220. A portion of the ground layer 218 is not totally encompassed by dielectric layers 216 and 220, as can be seen by the ground layer portion formed on dielectric layer 220 over the distance 222.

Substrates 200 and 202 can be interconnected by aligning the substrates in such a way that signal traces 204 are aligned with signal traces 214, and ground layer 212 is aligned with ground layer 218. By moving the substrates 200 and 202 towards each other, as represented by arrow 224, the signal and ground layer of the two substrates are electrically coupled.

Figure 9:
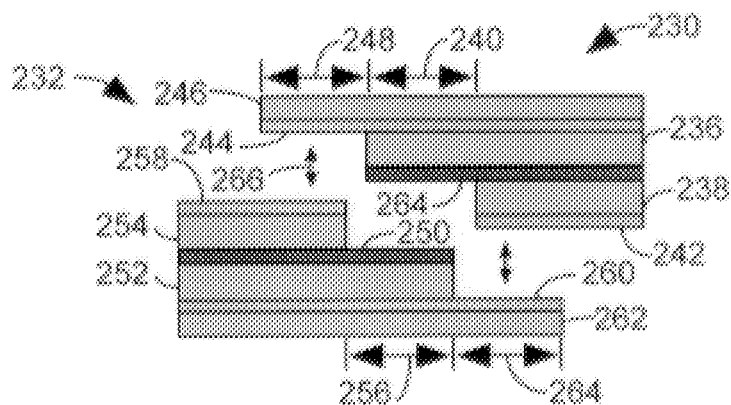
FIG. 9 illustrates another embodiment of two stripline substrates which form two continuous ground planes.
Figure 1:
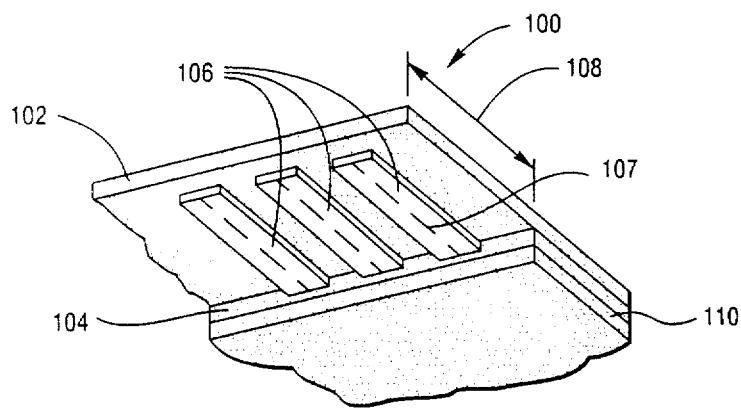
Figure 2:
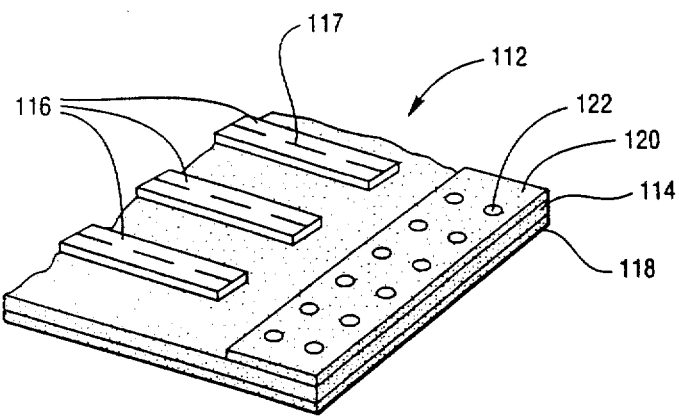
Figure 3:
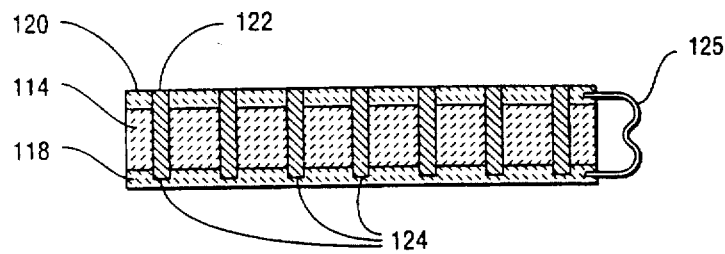
Figure 4:
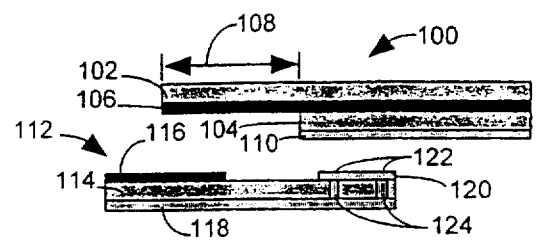
Figure 5:
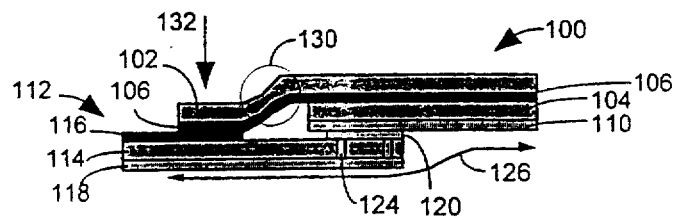
Figure 6:
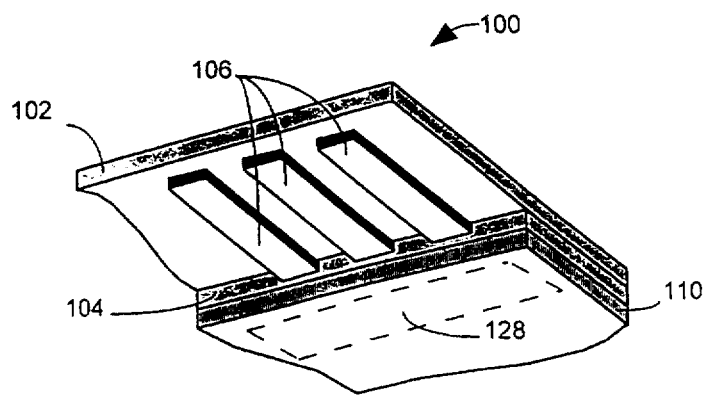
Figure 7:
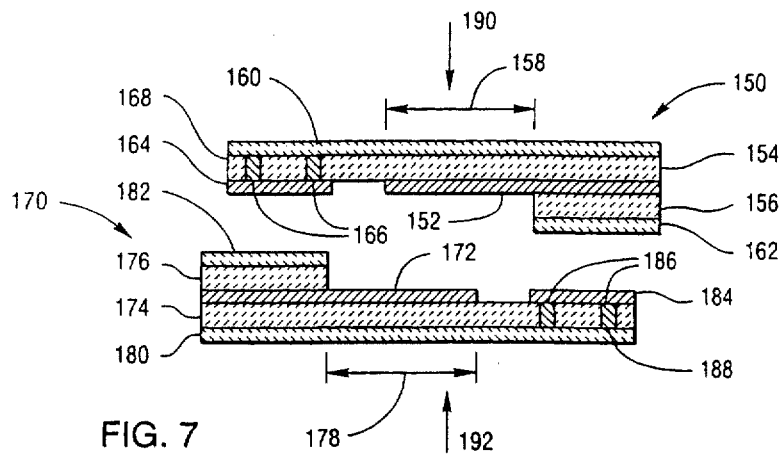
Figure 8:
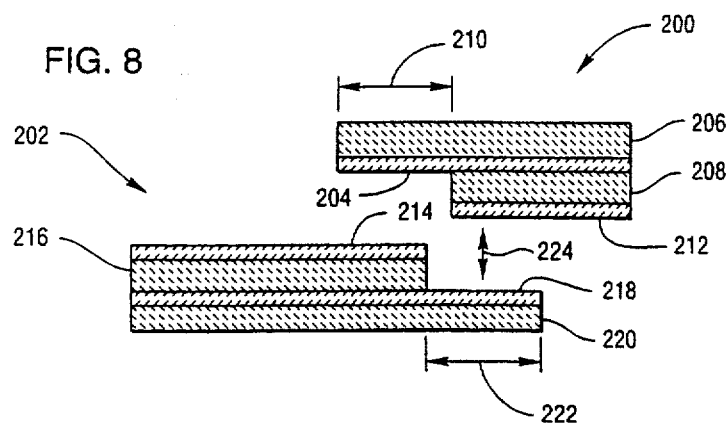
Figure 9:
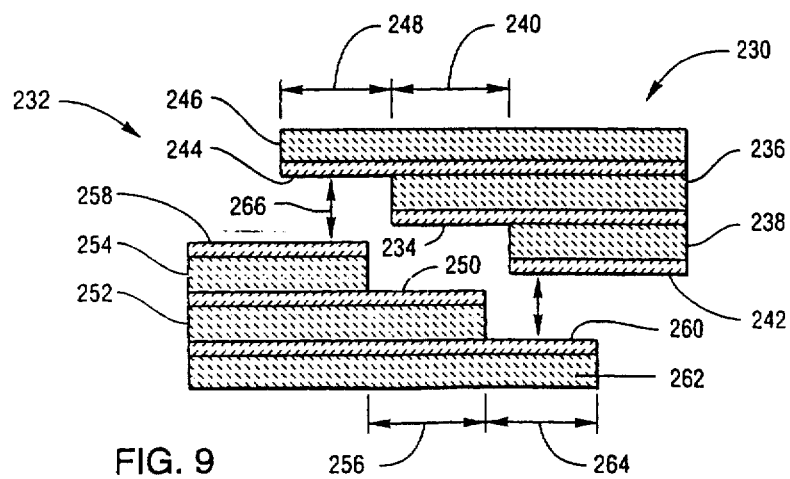

Referring now to FIG. 9, the principles described for the interconnection of FIGS. 7 and 8 may also be applied to stripline substrates 230 and 232 of FIG. 9. Substrate 230 has one or more signal traces 234 disposed between two dielectric layers 236 and 238. A portion of the signal traces 234 are not totally encompassed by dielectric layers 236 and 238. This can be seen by the signal trace portion formed on dielectric layer 236 over the distance 240. A first ground layer 242 is disposed on dielectric layer 238, and a second ground layer 244 is disposed between dielectric layer 236 and another dielectric layer 246. A portion of the ground layer 244 is not totally encompassed by dielectric layers 236 and 246, as can be seen by the ground layer portion formed on dielectric layer 246 over the distance 248.

Substrate 232 similarly has one or more signal traces 250 disposed between two dielectric layers 252 and 254. A portion of the signal traces 250 are exposed, as can be seen by the portion of the signal traces 250 over the distance 256. A first ground layer 258 is disposed on dielectric layer 254, and a second ground layer 260 is disposed between dielectric layer 252 and another dielectric layer 262. A portion of the ground layer 260 is not totally encompassed by dielectric layers 252 and 262, as can be seen by the ground layer portion formed on dielectric layer 262 over the distance 264.

Substrates 230 and 232 can be interconnected by aligning the substrates in such a way that the ground layer 244 is aligned with ground layer 258, signal traces 234 are aligned with signal traces 250, and ground layer 242 is aligned with ground layer 260. By moving the substrates 230 and 232 towards each other, as represented by arrow 266, the signal and ground layers of the two substrates are electrically coupled.

The embodiments of FIGS. 8 and 9 represent embodiments where continuous ground planes are formed without the need for the conductive members between ground planes, which allows continuous ground planes to be formed between the ground planes of interconnecting substrates. The embodiments of FIGS. 8 and 9 do, however, require the use of an additional dielectric layer on each substrate over those shown in the other figures which use through-holes or solid conductors between substrate layers. The additional layers may cause the substrate to have a more rigid structure, which may or may not be beneficial in a particular implementation. The circuit interconnection of FIG. 9 provides low inductance, continuous ground planes on both sides of the signal traces on the interconnecting substrates which may provide some beneficial shielding properties.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

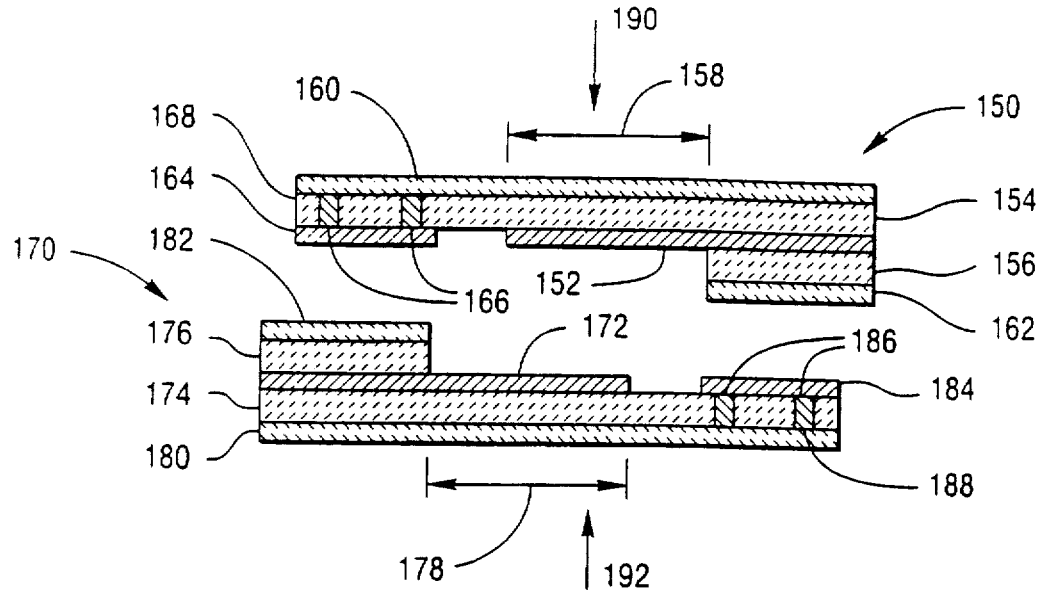

What is claimed is:

1. A circuit interconnection for electrically coupling the signals of two communications devices, the circuit interconnection comprising:
    (a) first and second substrates, each comprising a signal conductor disposed on an inner surface between first and second dielectric layers, the first dielectric layer covering only a portion of the signal conductor and the second dielectric layer such that the signal conductor has an exposed portion, the signal conductor in the exposed portion having a proximal end adjacent the first dielectric layer and a distal end;
    (b) a first ground layer disposed on an outer surface of the first dielectric layer of the first substrate;
    (c) a second ground layer disposed on an outer surface of the second dielectric layer of the second substrate;
    (d) a ground conductor strip disposed on the inner surface of the second dielectric layer of the second substrate which extends beyond the distal end of the signal conductor of the second substrate; and
    (e) a plurality of electrically conductive members which pass through the second dielectric layer of the second substrate to electrically couple the ground conductor strip and the second ground layer such that when the first substrate is placed proximate to the second substrate, the exposed portion of the signal conductor of each substrate are electrically coupled and the ground conductor strip electrically couples the first and second ground layers to form a continuous ground plane.

2. The circuit interconnection of claim 1 further comprising:
    (a) a third ground layer disposed on an outer surface of the second dielectric layer of the first substrate;
    (b) a fourth ground layer disposed on an outer surface of the first dielectric layer of the second substrate;
    (c) a second ground conductor strip disposed on the inner surface of the second dielectric layer of the first substrate which extends beyond the distal end of the signal conductor of the first substrate; and
    (d) a second plurality of electrically conductive members which pass through the second dielectric layer of the first substrate to electrically couple the second ground conductor strip and the third ground layer such that when the first substrate is placed proximate to the second substrate, the second ground conductor strip electrically couples the third and fourth ground layers to form a second continuous ground plane.

3. A circuit interconnection including at least a first and a second substrate, each substrate comprising:
    (a) a first ground layer having an exposed top side, and having a bottom side positioned proximate a first dielectric layer; and
    (b) at least one signal trace positioned between the first dielectric layer and a second dielectric layer, the at least one signal trace and the second dielectric layer extending beyond an end of the first ground layer and the first dielectric layer;
    a second ground layer positioned between the second dielectric layer and a third dielectric layer, the second ground layer and the third dielectric layer extending beyond an end of the at least one signal trace and the second dielectric layer, the first and the second substrates being formed such that, when one substrate is rotated 180° with respect to the other substrate into a mating position, the first ground layer of each substrate is electrically coupled to the second ground layer of the other substrate to form a mated circuit interconnection.

4. The circuit interconnection of claim 3 wherein the first ground layers are electrically coupled to the second ground layers and the at least one signal trace of the first and second substrates are electrically coupled to one another by flexing the first substrate to contact the second substrate.

5. The circuit interconnection of claim 3 wherein the electrical coupling of the first ground layers to the second ground layers forms a first and a second continuous ground plane.

6. A circuit interconnection for electrically coupling the signals of two communications devices, the circuit interconnection comprising:
    (a) a first substrate comprising a signal conductor disposed on an inner surface between first and second dielectric layers, the first dielectric layer covering only a portion of the signal conductor and the second dielectric layer such that the signal conductor has an exposed portion, the signal conductor in the exposed portion having a proximal end adjacent the first dielectric layer and a distal end, and a first ground layer disposed on an outer surface of the first dielectric layer; and
    (b) a second substrate comprising a first dielectric layer disposed on an outer surface of a first ground layer, and a signal conductor disposed on an outer surface of the first dielectric layer, the signal conductor and the first dielectric layer covering only a portion of the first ground layer such that the first ground layer has an exposed portion, the first ground layer in the exposed portion having a proximal end adjacent the first dielectric layer and a distal end, such that when the first substrate is placed proximate to the second substrate, the signal conductors of each of the substrates are electrically coupled and the ground layers of each of the substrates are electrically coupled to form a continuous ground plane.

7. A circuit interconnection as in claim 6, wherein the second substrate further comprises a second dielectric layer disposed on the outer surface of the ground layer opposite of the first dielectric layer.

8. The circuit interconnection of claim 6 wherein the signal conductors of each of the substrates comprise signal traces.

9. The circuit interconnection as in claim 8 wherein the exposed portions of the signal traces are volumetrically reduced to maintain a constant signal trace impedance over a total length of the signal traces.

10. The circuit interconnection of claim 6 where at least the first substrate is flexible.

11. A circuit interconnection for electrically coupling the signals of two communications devices, the circuit interconnection comprising:

(a) a first substrate comprising a signal conductor disposed on an inner surface between first and second dielectric layers, the first dielectric layer covering only a portion of the signal conductor and the second dielectric layer such that the signal conductor has an exposed portion, the signal conductor in the exposed portion having a proximal end adjacent the first dielectric layer and a distal end, and a first ground layer disposed on an outer surface of the first dielectric layer; and (b) a second substrate comprising a first dielectric layer disposed on an outer surface of a first ground layer, and a signal conductor disposed on an outer surface of the first dielectric layer, the signal conductor covering only a portion of the first dielectric layer such that the first dielectric layer has an exposed portion, the first dielectric layer in the exposed portion having a proximal end adjacent the signal conductor and a distal end, such that when the first substrate is placed proximate to the second substrate the signal conductors of each of the substrates are electrically coupled and the ground layers of each of the substrates are electrically coupled to form a continuous ground plane.

12. A circuit interconnection as in claim 11, further comprising a ground conductor strip disposed on the outer surface of the first dielectric layer of the second substrate, wherein the ground conductor strip comprises a plurality of electrically conductive members which pass through the second substrate to electrically couple the ground conductor strip and the ground layer such that when the first substrate is placed proximate the second substrate, the ground conductor strip electrically couples each of the ground layers to form a continuous ground plane.

13. The circuit interconnection of claim 11 wherein the signal conductors of each of the substrates comprise signal traces.

14. The circuit interconnection as in claim 13 wherein the exposed portions of the signal traces are volumetrically reduced to maintain a constant signal trace impedance over a total length of the signal traces.

15. The circuit interconnection of claim 11 where at least the first substrate is flexible.

* * * * *

UNITED STATES PATENT AND TRADEMARK OFFICE
CERTIFICATE OF CORRECTION

PATENT NO. : 5,808,529
DATED : Sep. 15, 1998
INVENTOR(S) : John D. Hamre

It is certified that error appears in the above-identified patent and that said Letters Patent is hereby corrected as shown below:

The title page should be deleted to appear as per attached title page.

Please delete drawing sheets 1-3 and substitute drawing sheets 1-3 as per attached.

Signed and Sealed this

Sixteenth Day of February, 1999

Attest:

*Attesting Officer*

*Acting Commissioner of Patents and Trademarks*

United States Patent [19]

Hamre

[11] Patent Number: 5,808,529

[45] Date of Patent: Sep. 15, 1998

[54] PRINTED CIRCUIT BOARD LAYERING CONFIGURATION FOR VERY HIGH BANDWIDTH INTERCONNECT

[75] Inventor: John D. Hamre, Plymouth, Minn.

[73] Assignee: Storage Technology Corporation, Louisville, Colo.

[21] Appl. No.: 678,982

[22] Filed: Jul. 12, 1996

[51] Int. Cl.$^6$ .................................. H01P 3/08; H01P 5/00
[52] U.S. Cl. ........................... 333/246; 333/238; 333/260
[58] Field of Search ................................ 333/238, 246, 333/260

[56] References Cited

U.S. PATENT DOCUMENTS

| | | | |
|---|---|---|---|
| 3,218,584 | 11/1965 | Ayer | 333/246 |
| 4,513,266 | 4/1985 | Ishihara | 333/246 X |
| 4,543,544 | 9/1985 | Ziegner | 333/238 X |
| 4,980,659 | 12/1990 | Allard | 333/246 X |
| 4,988,306 | 1/1991 | Hopfer, III et al. | 439/66 |
| 5,013,249 | 5/1991 | Lindeman et al. | 439/66 |
| 5,055,054 | 10/1991 | Doutrich | 439/66 |
| 5,128,831 | 7/1992 | Fox, III et al. | 361/396 |
| 5,186,632 | 2/1993 | Horton et al. | 439/67 |
| 5,198,965 | 3/1993 | Curtis et al. | 361/386 |
| 5,258,730 | 11/1993 | Stern et al. | 333/246 |
| 5,261,826 | 11/1993 | Leeb et al. | 439/67 |
| 5,263,868 | 11/1993 | Renn et al. | 439/67 |
| 5,384,690 | 1/1995 | Davis et al. | 361/789 |
| 5,469,130 | 11/1995 | Okada et al. | 333/246 |

Primary Examiner—Robert Pascal
Assistant Examiner—Barbara Summons
Attorney, Agent, or Firm—Brooks & Kushman, P.C.

[57] ABSTRACT

A ground plane interconnection is provided on first and second substrates, the first and second substrates having respective first and second ground layers disposed on a first surface of each of the first and second substrates. A ground conductor strip is disposed on a second surface of the second substrate, wherein the ground conductor strip includes a plurality of electrically conductive members which pass through the second substrate to electrically couple the ground conductor strip and the second ground layer. The first substrate is positioned with respect to the second substrate such that when the first substrate is placed proximate the second substrate, the ground conductor strip electrically couples the first and second ground layers to form a continuous ground plane. A method of forming a reduced-inductance continuous ground plane is also provided.

15 Claims, 3 Drawing Sheets